United States Patent [19]

Turner et al.

[11] Patent Number: 4,945,030

[45] Date of Patent: Jul. 31, 1990

[54] METHOD FOR DEVELOPING LITHOGRAPHIC PLATES COMPRISING A DEVELOPER COMPRISING ETHYLENE OXIDE/PROPYLENE OXIDE BLOCK COPOLYMERS

[75] Inventors: Gregory P. Turner, Belle Isle; David S. Riley, Gildersome, both of England

[73] Assignee: Horsell Graphics Industries Limited, Leeds, England

[21] Appl. No.: 393,047

[22] Filed: Aug. 7, 1989

Related U.S. Application Data

[63] Continuation of Ser. No. 124,838, Nov. 24, 1987, abandoned.

[30] Foreign Application Priority Data

Nov. 29, 1986 [GB] United Kingdom ............... 8628613

[51] Int. Cl.$^5$ .......................... G03C 5/24; G03C 5/34
[52] U.S. Cl. .................................. 430/331; 430/309; 430/325
[58] Field of Search .................. 430/309, 331, 325; 252/174.14, 174.21

[56] References Cited

U.S. PATENT DOCUMENTS

| | | | |
|---|---|---|---|
| 3,696,057 | 10/1972 | Shussler et al. | 252/DIG. 14 |
| 3,869,412 | 3/1975 | Waag | 252/527 |
| 4,142,895 | 3/1979 | Frank et al. | 430/490 |
| 4,244,832 | 1/1981 | Kaneko | 252/99 |
| 4,374,076 | 2/1983 | Stephan et al. | 264/19 |
| 4,374,920 | 2/1983 | Wanat et al. | 430/331 |
| 4,395,480 | 7/1983 | Sprintschnik | 430/309 |
| 4,436,807 | 3/1984 | Walls | 430/331 |
| 4,496,647 | 1/1985 | Kawabe et al. | 430/309 |
| 4,576,903 | 3/1986 | Baron et al. | 430/331 |
| 4,592,992 | 6/1986 | Hsien et al. | 430/309 |
| 4,649,101 | 3/1987 | Thiel et al. | 430/331 |
| 4,680,251 | 7/1987 | Schober | 430/306 |
| 4,786,578 | 11/1988 | Neisus et al. | 430/256 |

*Primary Examiner*—Paul R. Michl
*Assistant Examiner*—Patrick A. Doody
*Attorney, Agent, or Firm*—Klauber & Jackson

[57] ABSTRACT

A developing fluid for positive-acting, negative-acting and reversible lithographic printing plates comprises a metasilicate as alkali together with an ethylene oxide/propylene oxide block copolymer and, optionally, sodium tetraborate, a phosphate ester, and anti-foaming agent and a water-softening or sequestering agent. The fluid has a high alkali content for reducing the need for frequent replenishment while at the same time minimizing damage to the image particularly in negative and reversed plates and avoiding unacceptable foaming and turbidity.

16 Claims, No Drawings

METHOD FOR DEVELOPING LITHOGRAPHIC PLATES COMPRISING A DEVELOPER COMPRISING ETHYLENE OXIDE/PROPYLENE OXIDE BLOCK COPOLYMERS

This application is a continuation, of application Ser. No. 07/124,838, filed Nov. 24, 1987 now abandoned.

The invention relates to aqueous alkaline developing fluids for lithographic printing plates. Whilst the fluids of the invention have application in the development of positive plates, such as those having a light-sensitive coating comprising an ortho-quinone diazide, and negative plates, they may also be used as developer in the preparation of negative images on reversible plates such as are described in British Patent No. 2082339.

In the post-exposure development of lithographic printing plates, the developing fluid becomes exhausted by chemical reaction as development proceeds, and the fluid needs to be replaced or replenished from time to time. Because this step involves an interruption of the operation, and because this interruption is particularly irksome whem development is carried out in an automatic plate processing machine, it is desirable that the fluid shall have as high an initial alkali content as practicable, so that it will not exhaust so quickly by chemical reaction.

However, it has been found that merely increasing the alkali content, that is to say without at the same time introducing other changes to the fluid, results in damage to substrates and images thereon, and particularly to the negative image produced on reversed plates, and it is an object of the present invention to mitigate these problems.

According to the invention therefore there is provided a developing fluid for lithographic printing plates comprising between 5% and 30% by weight of an alkali and between 0.01% and 10% by weight of an ethylene oxide/propylene oxide block copolymer.

The alkali is preferably a silicate and particularly sodium metasilicate, and the copolymer is preferably one of a group comprising:

(a) a copolymer formed between ethylene oxide, propylene oxide and ethylene diamine;
(b) a copolymer wherein the terminal groups are ethylene oxide chains of the same or different length; and
(c) a copolymer wherein the terminal groups are propylene oxide chains of the same or different length.

The fluid may also comprise any one or more of disodium tetraborate, a phosphate ester, an amine ethoxylate, a water softening or sequestering agent and a dyestuff. The water softening agent or sequestering agent may be one of a group comprising (a) an organophosphonate and (b) an aminocarboxylic acid. Preferably the organophosphonate is sodium pentaethylenehexamine octakis (methylene phosphonate) or the aminocarboxylic acid is 1,3-diamino-2-propanol-N,N,N',N'-tetra acetic acid.

The invention will be exemplified by reference to two Examples of formulae which have been found to be particularly effective.

EXAMPLE 1

An aqueous developer solution was compounded of the following ingredients, expressed in percentage by weight:

| | |
|---|---|
| Sodium metasilicate | 15% |
| Borax | 2% |
| Triton H66 ( TM of Robm & Haas) | 2.5% |
| Synperonic T/304 ( TM of I.C.I.) | 0.2% |
| Triton CF-32 (T.M. of Rohm & Haas) | 0.02% |
| Cibacron Golden Yellow 2R | 0.0036% |
| Cibacron Red 6B | 0.0004% |
| Briquest 8106/25S ( TM of Albright and Wilson) | 1.0% |

Where Triton H66 is a 50% aqueous solution of a phosphate ester, Synperonic T/304 is 100% liquid block copolymer, Triton CF-32 is a 95% aqueous solution of an amine ethoxylate, and Briquest 8106/25S is a 25% aqueous solution of Sodium pentaethylene hexamine octakis (methylene phosphonate).

The composition decribed achieves a balance, not to be expected from the known properties of the individual components, which provides a beneficial required increase in developement capacity without unacceptably damaging the image and whilst avoiding other problems such as foaming.

When non-preferred alkalis, commonly used in developers, were substituted for the silicate, either the substrate tended to be attacked or the plate coating was not completely developed.

The efficacy of the new developer was demonstrated by laboratory tests in which exposed positive lithographic plates were passed through developer until the fluid was exhausted. The table below shows the plate area developed per liter of fluid; the first four fluids being positive developers currently marketed, and the fifth a fluid according to the above exemplified formula.

| Developer | Square Meters per Liter |
|---|---|
| Horsell Hand Developer Type C1290 | 9.08 |
| Horsell Machine Developer Type C1291 | 9.08 |
| Horsell Developer Type C1331 | 10.9 |
| Howson-Algraphy Posidev E | 11.74 |
| Improved Positive Developer | 18.16 |

The range of acceptable proportions of the individual components of the fluid is particularly narrow; wide diversion from the values indicated leads to undesirable effects, such as an unacceptable level of attack on the image, the production of excess foam, the formation of a precipitate in hard water or the development of turbidity on storage.

EXAMPLE 2

The formula was identical to that of Example 1 with the replacement of the Briquest by 0.29% by weight of Rexpronal Acid (T.M. or W.R. Grace) which is a solid comprising 86% 1,3-diamino-2-propanol-N,N,N', N'-tetra acetic acid. A developer acording to this example was found to be effective with positive, negative and reversible plates.

We claim:

1. A method for developing lithographic printing plates, negative-acting and reversible lithographic printing plates comprising treating said plates with a developing fluid comprising between 12.5% and 17.5% by weight of an alkali and between about 0.01 and 10% by weight of an ethylene oxide/propylene oxide block copolymer.

2. A method according to claim 1 wherein the alkali comprises a silicate and the copolymer constitutes between 0.1 and 4.0% of total weight.

3. A method according to claim 1 or claim 2 wherein the alkali is a metasilicate.

4. A method according to claim 3 wherein the metasilicate is sodium metasilicate.

5. A method according to claim 1 wherein the copolymer is one of a group comprising:
   (a) a copolymer formed between ethylene oxide, propylene oxide and ethylene diamine;
   (b) a copolymer wherein the terminal groups are ethylene oxide chains of the same or different length; and
   (c) a copolymer wherein the terminal groups are propylene oxide chains of the same or different length.

6. A method according to claim 1 further comprising disodium tetraborate.

7. A method according to claim 6 wherein the disodium tertraborate is present in the range 0.5 to 4% by weight.

8. A method according to claim 1 further comprising a phosphate ester.

9. A method according to claim 8 wherein the phosphate is a potassium salt.

10. A method according to claim 1 further comprising an anti-foaming agent.

11. A method according to claim 10 wherein the anti-foaming agent comprises an amine ethoxylate.

12. A method according to claim 11 wherein the amine ethoxylate comprises 0.01 to 0.05% by weight.

13. A method according to claim 1 further comprising a water softening or sequestering agent.

14. A method according to claim 13 wherein the water softening agent or sequestering agent is one of a group comprising (a) an organophosphonate and (b) an aminocarboxylic acid.

15. A method according to claim 14 wherein the organophosphonate is sodium pentaethylenehexamine octakis (methylene phosphonate) and the aminocarboxylic acid is 1,3-diamino-2-propanol-N,N,N',N'-tetra acetic acid.

16. A method according to claim 1 further comprising a dyestuff.

* * * * *

UNITED STATES PATENT AND TRADEMARK OFFICE
CERTIFICATE OF CORRECTION

PATENT NO. : 4,945,030

DATED : JULY 31, 1990

INVENTOR(S) : GREGORY P. TURNER AND DAVID S. RILEY

It is certified that error appears in the above-identified patent and that said Letters Patent is hereby corrected as shown below:

IN THE TITLE OF THE PATENT, ON THE FACE OF THE PATENT, AND IN COL. 1. AMEND THE TITLE TO READ:

-- METHOD FOR DEVELOPING LITHOGRAPHIC PLATES USING A DEVELOPER COMPRISING ETHYLENE OXIDE/PROPYLENE OXIDE BLOCK COPOLYMERS --.

Signed and Sealed this

Twenty-fourth Day of September, 1991

Attest:

HARRY F. MANBECK, JR.

Attesting Officer

Commissioner of Patents and Trademarks